United States Patent
Flanders

(10) Patent No.: US 9,316,483 B2
(45) Date of Patent: Apr. 19, 2016

(54) OCT SWEPT LASER WITH HIGH COHERENCE SIGNAL EXTRACTION

(71) Applicant: Axsun Technologies, Inc., Billerica, MA (US)

(72) Inventor: Dale C. Flanders, Lexington, MA (US)

(73) Assignee: Axsun Technologies LLC, Billerica, MA (US)

( * ) Notice: Subject to any disclaimer, the term of this patent is extended or adjusted under 35 U.S.C. 154(b) by 35 days.

(21) Appl. No.: 14/144,634

(22) Filed: Dec. 31, 2013

(65) Prior Publication Data

US 2015/0184994 A1     Jul. 2, 2015

(51) Int. Cl.
| | |
|---|---|
| G01B 9/02 | (2006.01) |
| H01S 3/106 | (2006.01) |
| H01S 5/14 | (2006.01) |
| H01S 3/08 | (2006.01) |
| H01S 3/081 | (2006.01) |
| H01S 3/083 | (2006.01) |
| H01S 5/022 | (2006.01) |
| H01S 5/10 | (2006.01) |

(52) U.S. Cl.
CPC ........ *G01B 9/02004* (2013.01); *G01B 9/02091* (2013.01); *H01S 3/1062* (2013.01); *H01S 5/141* (2013.01); *H01S 3/083* (2013.01); *H01S 3/0816* (2013.01); *H01S 3/08054* (2013.01); *H01S 5/02248* (2013.01); *H01S 5/02284* (2013.01); *H01S 5/101* (2013.01)

(58) Field of Classification Search
CPC ............ G01B 9/02004; G01B 9/02091; H01S 3/08027; H01S 5/1071; H01S 5/183; H01S 5/3013

USPC .......................................................... 356/479
See application file for complete search history.

(56) References Cited

U.S. PATENT DOCUMENTS

| | | | |
|---|---|---|---|
| 5,164,954 A * | 11/1992 | Su .................................. | 372/94 |
| 6,345,059 B1* | 2/2002 | Flanders ......................... | 372/20 |
| 7,415,049 B2 | 8/2008 | Flanders et al. | |
| 8,670,129 B2 * | 3/2014 | Flanders et al. ............... | 356/519 |
| 2002/0163941 A1* | 11/2002 | Hsu et al. ......................... | 372/18 |
| 2005/0036535 A1* | 2/2005 | Knopp et al. .................. | 372/108 |
| 2006/0065834 A1* | 3/2006 | Flanders et al. .......... | 250/339.07 |
| 2006/0072632 A1* | 4/2006 | Flanders et al. ................ | 372/20 |
| 2006/0072633 A1* | 4/2006 | Flanders et al. ................ | 372/20 |
| 2009/0290167 A1* | 11/2009 | Flanders et al. .............. | 356/497 |
| 2012/0162662 A1* | 6/2012 | Johnson et al. ............... | 356/496 |

OTHER PUBLICATIONS

Huber, R., et al., "Fourier Domain Mode Locking (FDML): A new laser operating regime and applications for optical coherence tomography," Optics Express, vol. 14, No. 8, Apr. 17, 2006, 13 pages.

* cited by examiner

*Primary Examiner* — Tarifur Chowdhury
*Assistant Examiner* — Jonathon Cook
(74) *Attorney, Agent, or Firm* — HoustonHogle, LLP

(57) ABSTRACT

An optical coherence tomography system utilizes an optical swept laser that has improved coherence length in the swept optical signal. This is accomplished using an intra-cavity element that extracts the tunable optical signal at the optimal location within the laser's resonant cavity. Generally this location is between the intracavity tuning element and the cavity's gain element so that light coming from the tuning element is extracted. In general in lasers, the gain element adds noise and chirp and this degrades the tunable optical signal's coherence length.

20 Claims, 8 Drawing Sheets

OCT SWEPT LASER WITH HIGH COHERENCE SIGNAL EXTRACTION

BACKGROUND OF THE INVENTION

Optical coherence analysis relies on the interference phenomena between a reference wave and an experimental wave or between two parts of an experimental wave to measure distances and thicknesses, and calculate indices of refraction of a sample. Optical Coherence Tomography (OCT) is one example technology that is used to perform high-resolution cross sectional imaging. It is often applied to imaging biological tissue structures, for example, on microscopic scales in real time. Optical waves are reflected from an object or sample and a computer produces images of cross sections or three-dimensional volume renderings of the sample by using information on how the waves are changed upon reflection.

There are several different classes of OCT, but Fourier domain OCT currently offers the best performance for many applications. Moreover, of the Fourier domain approaches, swept-source OCT has distinct advantages over techniques such as spectrum-encoded OCT because it has the capability of balanced and polarization diversity detection. It has advantages as well for imaging in wavelength regions where inexpensive and fast detector arrays, which are typically required for spectrum-encoded OCT, are not available.

In swept source OCT, the spectral components are not encoded by spatial separation, but they are encoded in time. The spectrum is either filtered or generated in successive optical frequency sampling intervals and reconstructed before Fourier-transformation. Using the frequency scanning swept source, the optical configuration becomes less complex but the critical performance characteristics now reside in the source and especially its frequency sweep rate and tuning accuracy, along with its coherence length characteristics.

The swept sources for OCT systems have typically been tunable lasers. The advantages of tunable lasers include high spectral brightness and relatively simple optical designs. A tunable laser is constructed from a gain element, such as a semiconductor optical amplifier (SOA) that is located within a resonant laser cavity, and a tuning element such as a rotating grating, grating with a rotating mirror, or a Fabry-Perot tunable filter.

Currently, some of the highest tuning speed/sweep rate lasers are based on the laser designs described in U.S. Pat. No. 7,415,049 B1, entitled Laser with Tilted Multi Spatial Mode Resonator Tuning Element, by D. Flanders, M. Kuznetsov and W. Atia. The use of micro-electro-mechanical system (MEMS) Fabry-Perot tunable filters combines the capability for wide spectral scan bands with the low mass, high mechanical resonant frequency deflectable MEMS membranes that have the capacity for high speed tuning/sweep rates.

Another laser architecture is termed a Fourier-domain mode-locked laser (FDML). This type of laser stores light in a long length of fiber for amplification and recirculation in synchronism with the laser's tuning element. See "Fourier Domain Mode Locking (FDML): A new laser operating regime and applications for optical coherence tomography", R. Huber, M. Wojtkowski, and J. G. Fujimoto, 17 Apr. 2006/Vol. 14, No. 8/OPTICS EXPRESS 3225. The drawback of these devices is their complexity, however. Moreover, the ring cavity including the long storage fiber creates its own performance problems such as dispersion and instability.

An important metric for swept sources is coherence length. This refers to the propagation distance over which the source's optical signal maintains a specified degree of coherence. In OCT systems, longer coherence lengths enable imaging over longer depth ranges.

SUMMARY OF THE INVENTION

The present invention is directed to an OCT method and system and swept laser designs that can be used to improve coherence length of the swept optical signal. This is accomplished using an intra-cavity element that extracts the tunable optical signal at the optimal location within the laser's resonant cavity. Generally this location is between the intracavity tuning element and the cavity's gain element so that light coming from the tuning element is extracted. The present invention also concerns the simultaneous or selective generation of a tunable optical signal with different coherences lengths.

In general in lasers, the cavity gain element adds noise and/or distorts the spectral content of the light in the laser cavity. For example, the gain element often adds amplified spontaneous emissions (ASE) and this noise degrades the tunable optical signal's coherence length. This noise, however, is removed by the tuning element. The distortion that is added by the gain element arises from a different source. High speed swept lasers such as those often used in OCT systems exhibit a form of mode-locking, termed swept mode locking See e.g., U.S. Pat. Appl. Pub. No. US 2012/0162662 A1, which is incorporated herein by this reference. As a consequence, during operation, light within the laser cavity circulates in the form of one or more pulses, which strongly modulate the gain. Each pulse "hops" to a new optical frequency with the laser tuning, but there is also considerable chirp to the pulses. The chirp is added by the gain element. When these pulses are filtered, the pulses are longer and have smaller chirp than those that have just passed through the gain element.

Thus, by extracting the tunable optical signal post filtering but before amplification, the coherence length is improved.

In general, according to one aspect, the invention features a swept laser that generates a swept optical signal. The laser comprises a laser cavity in which the swept optical signal is generated, a tuning element for a controlling an optical frequency of the swept optical signal, a gain element for amplifying light in the laser cavity, and an optical signal extraction element located between the tuning element and the gain element for coupling the swept optical signal from the laser cavity after being filtered by the tuning element but before amplification by the gain element.

In embodiments, the laser cavity is a linear cavity and the signal extraction element is located downstream of the tuning element but upstream of the gain element. In one case, the signal extraction element is a beam splitter and the tuning element is a Fabry Perot tunable filter. In examples, quarter wave plates on either side of the tuning element are used to rotate the polarization of the optical signal within the laser cavity so that light transmitted through the tunable filter has a polarization that is appropriate for amplification by the gain element whereas light that is rejected by the tunable filter has a polarization that is orthogonal to the polarization at which the gain element amplifies light. The gain element can be a reflective semiconductor optical amplifier.

In one embodiment, a low coherence signal extraction port is provided that generates a lower coherence version of the swept optical signal.

In another embodiment, the laser cavity is a ring cavity.

In general, according to one aspect, the invention features an optical coherence tomography system comprising: an interferometer that combines a swept optical signal from a sample and from a reference path to generate an interference signal, a detection system that detects the interference signal, and a swept laser. This laser generates the swept optical signal and comprises a laser cavity, a gain element for amplifying light in the laser cavity, and an optical signal extraction element located within the laser cavity for coupling the swept optical signal from the laser cavity prior to amplification by the gain element.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

The invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Figure 1:
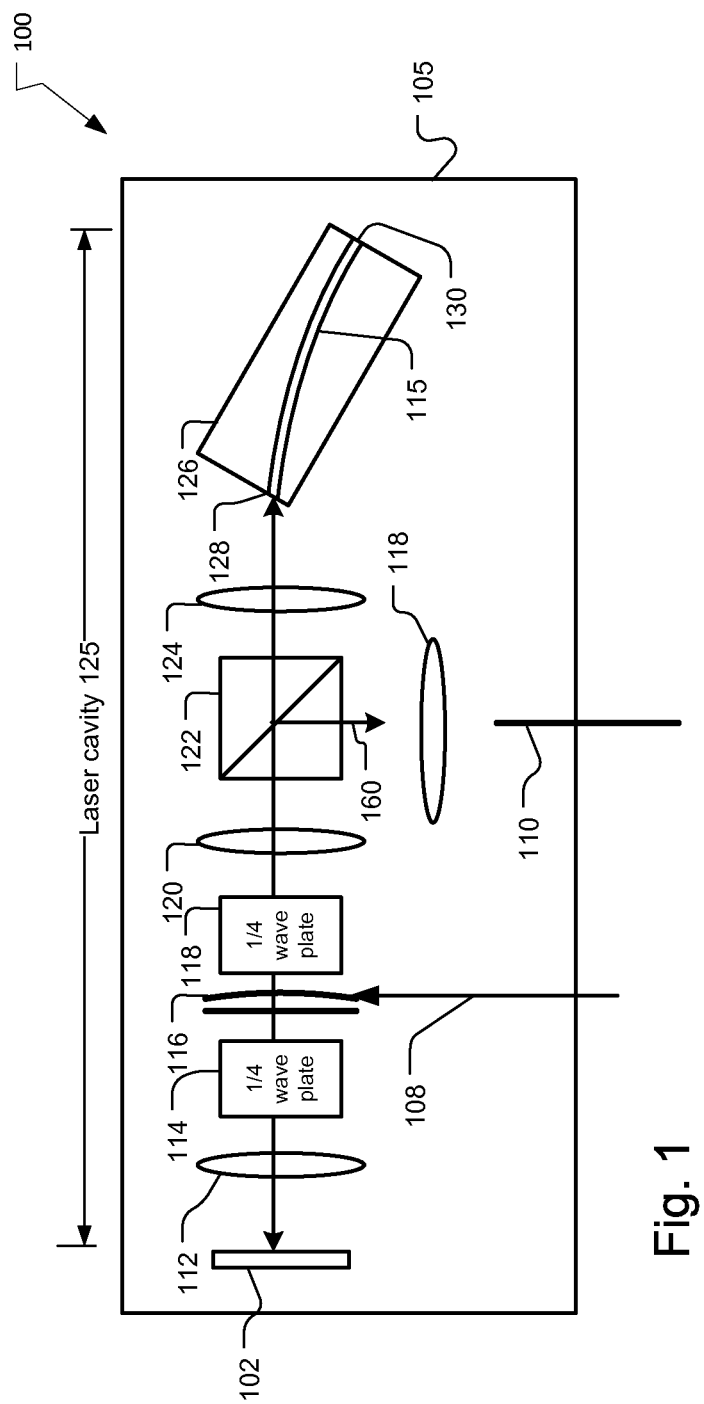
FIG. 1 is a schematic diagram illustrating a swept laser (linear cavity) according to the present invention.

Turning now to the drawing, FIG. 1 shows a swept laser source system 100 according to a first embodiment of the present invention.

In a preferred embodiment, a majority or all of the components of the swept laser 100 are installed on a common bench 105. The bench 105 is termed a micro-optical bench and is preferably less than 10 millimeters (mm) in width and about 25 mm in length or less. This size enables the bench to be installed in a standard, or near standard-sized, butterfly or DIP (dual inline pin) hermetic package. In one implementation, the bench 105 is fabricated from aluminum nitride. A thermoelectric cooler is disposed between the bench and the package (attached/solder bonded both to the backside of the bench and inner bottom panel of the package) to control the temperature of the bench 105.

As is characteristic of lasers, the swept laser 100 includes a laser (resonant) cavity 125. Light within the cavity 125 is coupled from it via a high coherence output port defined by output lens 118. In the illustrated example, the light or tunable signal is transmitted from the laser 100 and off of the bench 105 on an optical fiber 110. Typically the optical fiber 110 extends through a fiber feedthrough in the hermetic package.

In other examples, the output port is defined by a window in the hermetic package. The tunable signal is coupled from the bench 105 and through the package as a beam, thus avoiding the use of the fiber.

A gain element 126 is provided in the cavity 125. In a typical example, the gain element 126 is a semiconductor optical amplifier (SOA), which is mounted to the bench 105 via a submount. In other examples, a rare earth doped optical fiber gain element is used. Still other examples are solid-state optical gain media. The gain element 126 amplifies light within the cavity 125.

In the current embodiment, the input facet 128 of the SOA chip 126 is angled relative to the axis of the cavity and anti-reflection (AR) coated. The back facet 130 is coated to be reflective to define one end of the laser cavity 125. In the illustrated example, an edge emitting chip is used with a curved or arcuate ridge waveguide 115.

The other end of the laser cavity 125 is defined by mirror 102. Preferably, this mirror 102 also functions as a polarizing filter to remove light that is orthogonal to the gain polarization of the cavity 125. The gain polarization of the cavity at the location of the mirror 102 is actually orthogonal to the gain polarization of the SOA 126 due to a pair of quarter waveplates 114, 118.

The material system of the chip 126 is selected based on the desired spectral operating range. Common material systems are based on III-V semiconductor materials, including binary materials, such as GaN, GaAs, InP, GaSb, InAs, as well as ternary, quaternary, and pentenary alloys, such as InGaN, InAlGaN, InGaP, AlGaAs, InGaAs, GaInNAs, GaInNAsSb, AlInGaAs, InGaAsP, AlGaAsSb, AlGaInAsSb, AlAsSb, InGaSb, InAsSb, and InGaAsSb. Collectively, these material systems support operating wavelengths from about 400 nanometers (nm) to 2000 nm, including longer wavelength ranges extending into multiple micrometer wavelengths. Semiconductor quantum well and quantum dot gain regions are typically used to obtain especially wide gain and spectral emission bandwidths. Currently, edge-emitting chips are used although vertical cavity surface emitting laser (VCSEL) chips are used in different implementations.

In one implementation, the gain element 126 amplifies light at only one polarization, the gain polarization. It provides little or no gain at the orthogonal polarization.

Also within the cavity 125 is a tuning element 116, which is preferably mounted to the bench 105. The tuning element typically has a tunable passband (in reflection or transmission) that scans over a scan band. This passband overlaps with the gain spectrum of the gain element 126. This configuration allows optical energy within the passband to be amplified within the laser cavity 125 and thus coupled onto optical fiber 110 via the output port.

In some embodiments, the tuning element 116 is a micro mechanical system (MEMS) Fabry Perot tunable filter. In other examples, grating based tuning elements are used. Still other examples are acousto optic tunable filters.

The swept source system 100 is generally intended for high speed tuning to generate swept optical signals that repeatedly scan over the scan band(s) at rates of greater than 1 kiloHertz (kHz). In current embodiments, the laser system 100 tunes at speeds greater than 20 or 100 kHz. In very high speed embodiments, the multi-sweep rate swept source system 100 tunes at speeds greater than 200 or 500 kHz.

Typically, the width of the tuning or scan band is greater than 10 nanometers (nm). In the current embodiments, it is usually between 50 and 150 nm, although even wider tuning bands are contemplated in some examples. On the other hand, the bandwidth of the narrowband emission has a full width half maximum (FWHM) bandwidth of less than 20 or 10 GigaHertz (GHz), and is usually 5 GHz or less. For optical coherence tomography, this high spectral resolution implies a long coherence length and therefore enables imaging deeper into samples, for example deeper than 5 millimeters (mm). On the other hand, in lower performance applications, for example OCT imaging less than 1 mm deep into samples, broader FWHM passbands are sometimes appropriate, such as passbands of about 200 GHz or less.

The tuning speed can also be expressed in wavelength per unit time. In one example, for an approximately 110 nm tuning band or scanband and 100 kHz scan rate, assuming 60% duty cycle for substantially linear up-tuning, the peak sweep speed would be 110 nm*100 kHz/0.60=18,300 nm/msec=18.3 nm/μsec or faster. In another example, for an approximately 90 nm tuning range and 50 kHz scan rate, assuming a 50% duty cycle for substantially linear up-tuning, the peak sweep speed is 90 nm*50 kHz/0.50=9,000 nm/msec=9.0 nm/μsec or faster. In a smaller tuning band example having an approximately 30 nm tuning range and 2 kHz scan rate, assuming a 80% duty cycle for substantially linear tuning, the peak sweep speed would be 30 nm*2 kHz/0.80=75 nm/msec=0.075 nm/μsec, or faster.

Thus, in terms of scan rates, in the preferred embodiments described herein, the sweep speeds are greater than 0.05 nm/μsec and preferably greater than 5 nm/μsec. In still higher speed applications, the scan rates are higher than 10 nm/μsec.

According to the invention, the laser cavity 125 further comprises an optical signal extraction element 122. The signal extraction element 122 is located downstream of the tuning element 116 but upstream of the gain element 126 and extracts light from the tuning element 116 before it is transmitted to the gain element 126.

The advantage of extracting the tunable optical signal from this location within the laser cavity 125 is that the light has just been transmitted through the Fabry Perot tunable filter tuning element 116, in fact twice in the illustrated embodiment since its last amplification. Thus, its bandwidth corresponds to the passband of the tuning element 116. This extraction of the tunable optical signal, however, occurs prior to its amplification in the gain element 126. Typically, a gain element adds noise in addition to amplifying light at the passband. In the case of a semiconductor optical amplifier, this noise includes amplified spontaneous emissions.

Moreover, as discussed previously, the gain element 126 also tends to modulate the light circulating within the cavity 125. When operated as a swept source, with the tuning element 116 tuning over the scan band at a high rate, light circulates within the cavity as one or more pulses and the gain element chirps these pulses. The spectral broadening of the light circulating within the cavity by this chirping is counteracted by the double passing of the light through the tuning element 116 prior to extraction by the signal extraction element 122.

Thus, by extracting the tunable optical signal prior to amplification, the tunable optical signal is relatively free of the noise and spectral distortion that would be added by the gain element 126.

In the illustrated embodiment, the signal extraction element 122 is a beam splitter such as a partial beam splitter or a polarization beam splitter. It reflects light such as at a 90° angle. Often, it only couples approximately 1% to 10% of the light as the output tunable optical signal 160. In illustrated embodiment, this tunable optical signal is coupled by the lens 118 into the optical fiber 110.

Light that is outside the passband of the Fabry Perot tunable filter tuning element 116 is reflected by this filter. This light should not be amplified by the gain element 126 to ensure laser operation. As result, two quarter wave plates 114, 118 are located on either side of the Fabry Perot filter 116. These wave plates 114, 118 rotate the polarization of the optical signal within the laser cavity 125 so that light transmitted through the tunable filter has a polarization that is appropriate for amplification by the gain element 126. That is, the light is polarized parallel to the gain polarization in the case of a semiconductor optical amplifier gain element 126. In contrast, light that is rejected by the tunable filter 116 has a polarization that is orthogonal to the polarization at which the gain element 126 amplifies light.

In the illustrated example, a series of lenses 112, 120, and 124 are used to couple light between the various elements within the laser cavity 125 and on the bench 105. Specifically, lens 112 couples light between the mirror 102, through the first quarter wave plate 114 and into the tuning element 116. Lens 120 couples light between the tuning element 116, the second quarter wave plate 118, and the signal extraction element 122. Finally, lens 124 couples light between the front facet 128 of the gain element 126 and the signal extraction element 122.

Figure 2:
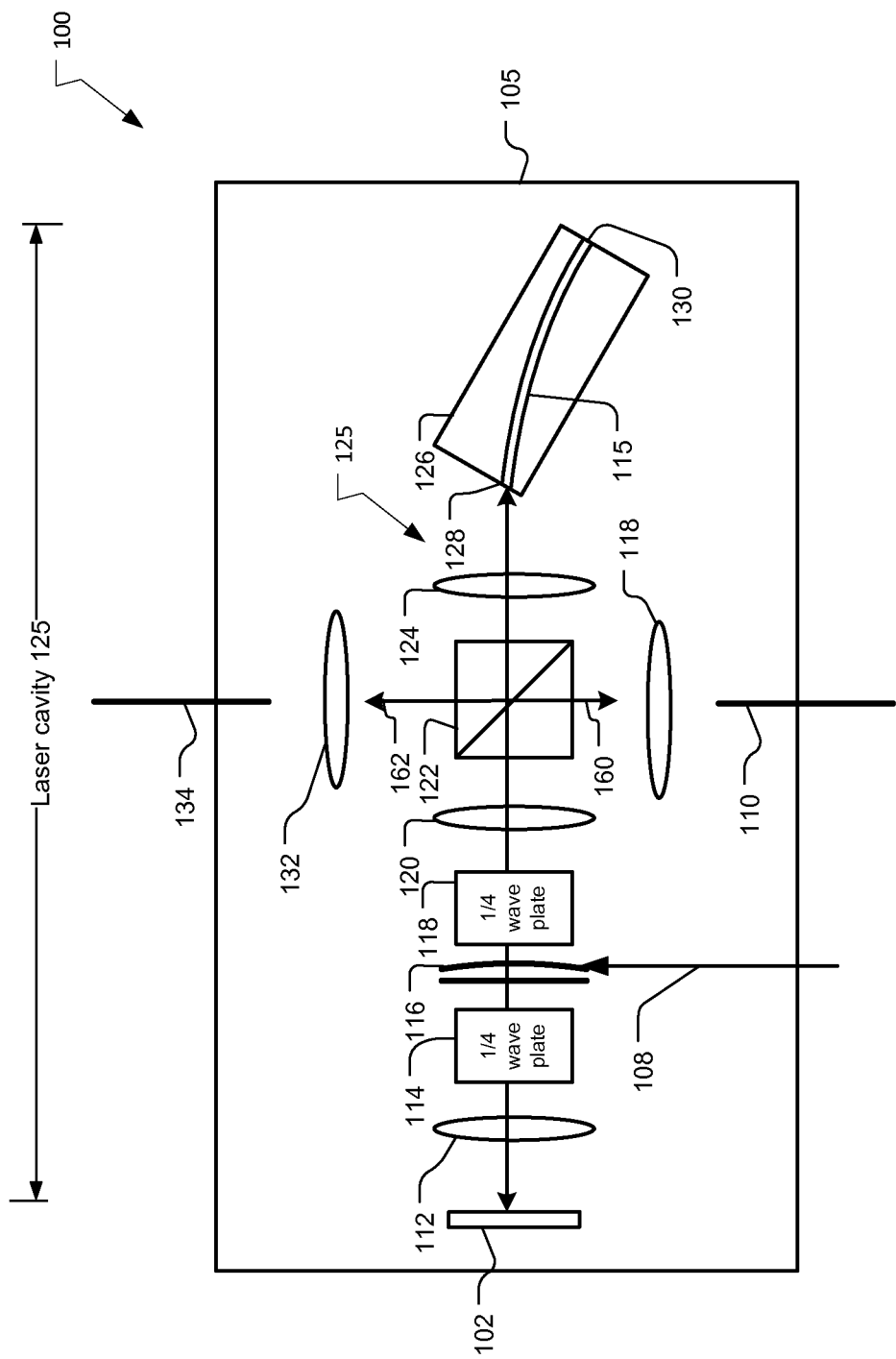
FIG. 2 is a schematic diagram illustrating a linear cavity swept laser according to a second embodiment of the present invention.

FIG. 2 shows a swept laser 100 according to a second embodiment of the present invention. This embodiment includes a low coherence high power extraction port defined by lens 132. Specifically, light that is returning from the gain element 126 on a path to the tuning element 116 is also reflected by the signal extraction element 122 to provide a low coherence version 162 of the tunable optical signal. Since this light includes the noise and spectral distortion contributed by the gain element 126, it generally has a lower coherence length than the tunable optical signal 160, but a much higher power since it comes directly from the gain element 126. This light is collected by lens 132 and coupled into an optical fiber 134 in one example. In other examples, it is coupled from the bench 105 as a beam.

Figure 3:
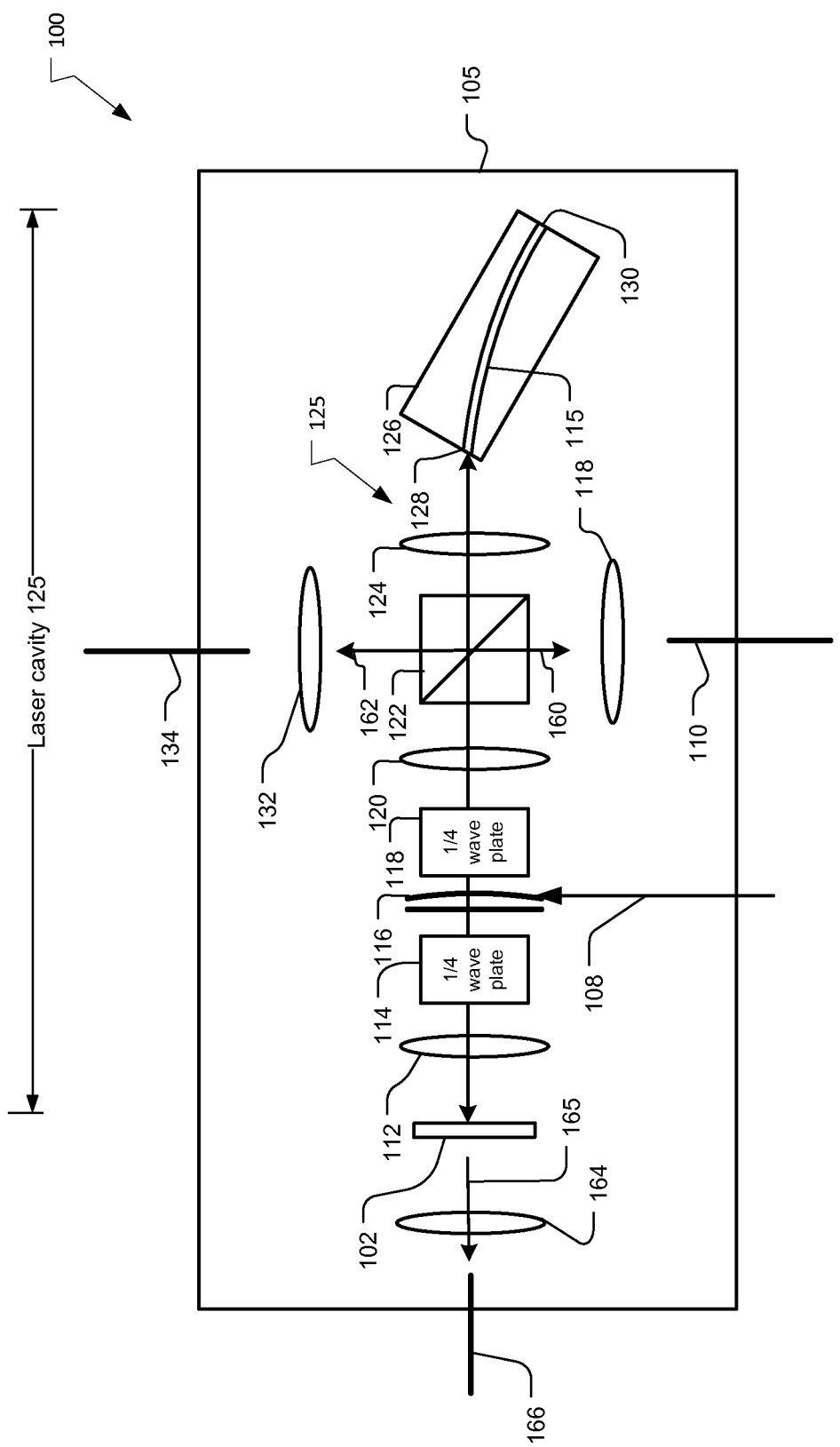
FIG. 3 is a schematic diagram illustrating a linear cavity swept laser according to a third embodiment of the present invention.

FIG. 3 shows a swept laser according to a third embodiment of the present invention. This embodiment further includes a medium coherence extraction port defined by lens 164. In general, the coherence length of the tunable signal 165 generated at this port will be lower than the tunable signal 160 but higher than tunable signal 162 since it has been filtered by one pass through the filter 116.

Specifically, mirror 102, which possibly further functions as the polarizing filter, is partially reflective/transmissive to allow the light that has been filtered by the tuning element 116 to pass through the partial mirror 102 to be collimated by lens 164 as a medium coherence version 165 of the tunable optical signal. This medium coherence version 165 of the tunable optical signal is coupled into optical fiber 166 in the illustrated embodiment.

Figure 4:
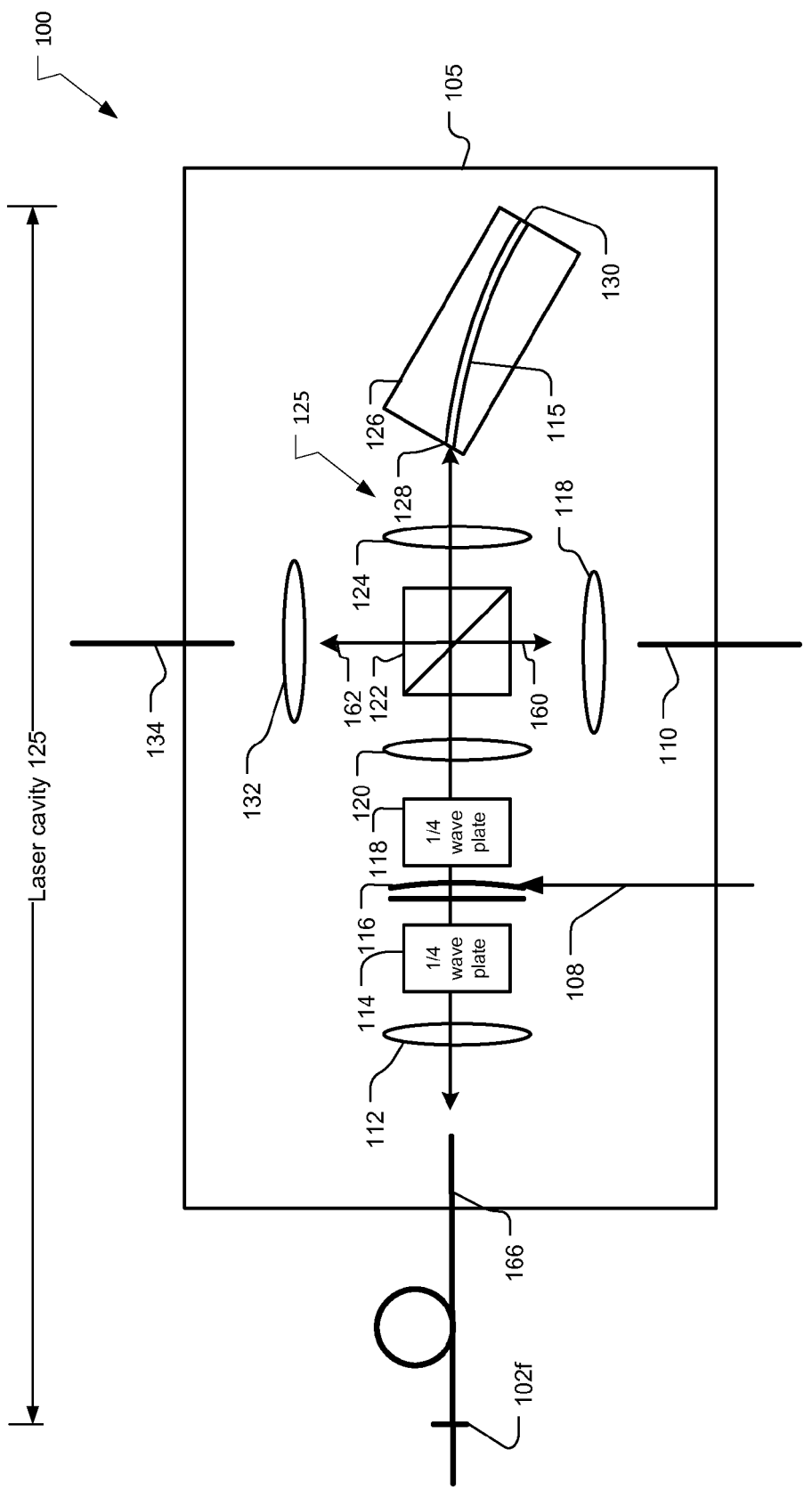
FIG. 4 is a schematic diagram illustrating a linear cavity swept laser according to a fourth embodiment of the present invention.

FIG. 4 shows a swept laser according to a fourth embodiment of the present invention. This embodiment also includes a medium coherence extraction port. Specifically, lens 112 couples light of the cavity 125 into fiber 166. A fiber mirror 102f, such a grating or partially reflective fiber splice, functions as a partially reflective/transmissive mirror to define the end of the cavity 125 and also as the medium coherence extraction port. The medium coherence version 165 of the tunable optical signal being transmitted through the fiber mirror 102f on fiber 166. The advantage of this embodiment is that longer laser cavities can be created that consequently have spectrally smaller longitudinal mode spacing.

Figure 5:
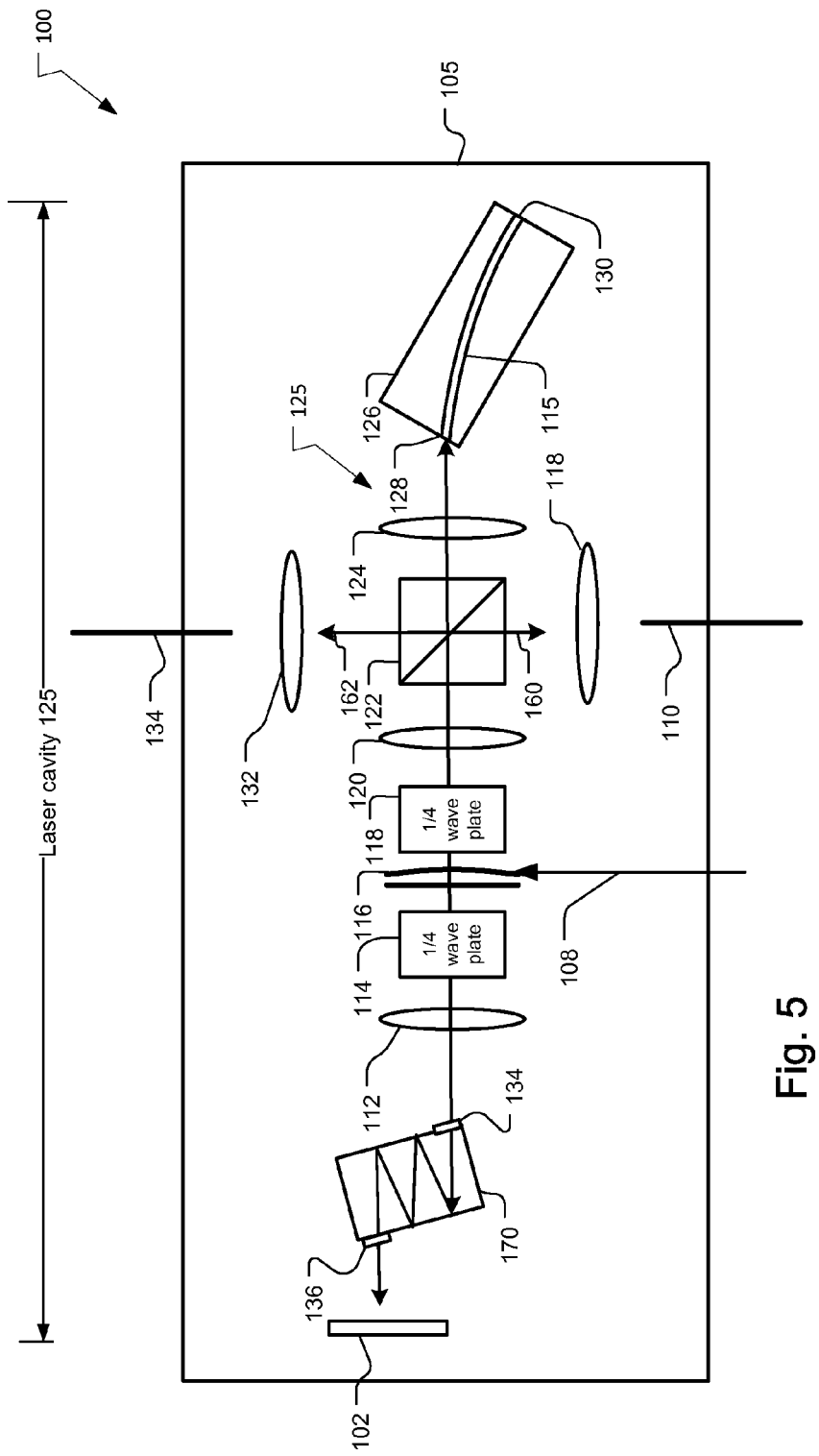
FIG. 5 is a schematic diagram illustrating a linear cavity swept laser according to a fifth embodiment of the present invention.

FIG. 5 shows a swept laser 100 according to a fifth embodiment of the present invention. This embodiment also includes a reflective cavity extender 170 between lens 112 and the mirror 102. It includes two antireflection coated facets 134, 136 to allow the light from the cavity 125 to be coupled into and out of the extender 170. In the extender, light propagates in a zig-zag pattern which increases the effective optical length of the laser cavity 125. Here again, longer laser cavities can be created that consequently have spectrally smaller longitudinal mode spacing.

Figure 6:
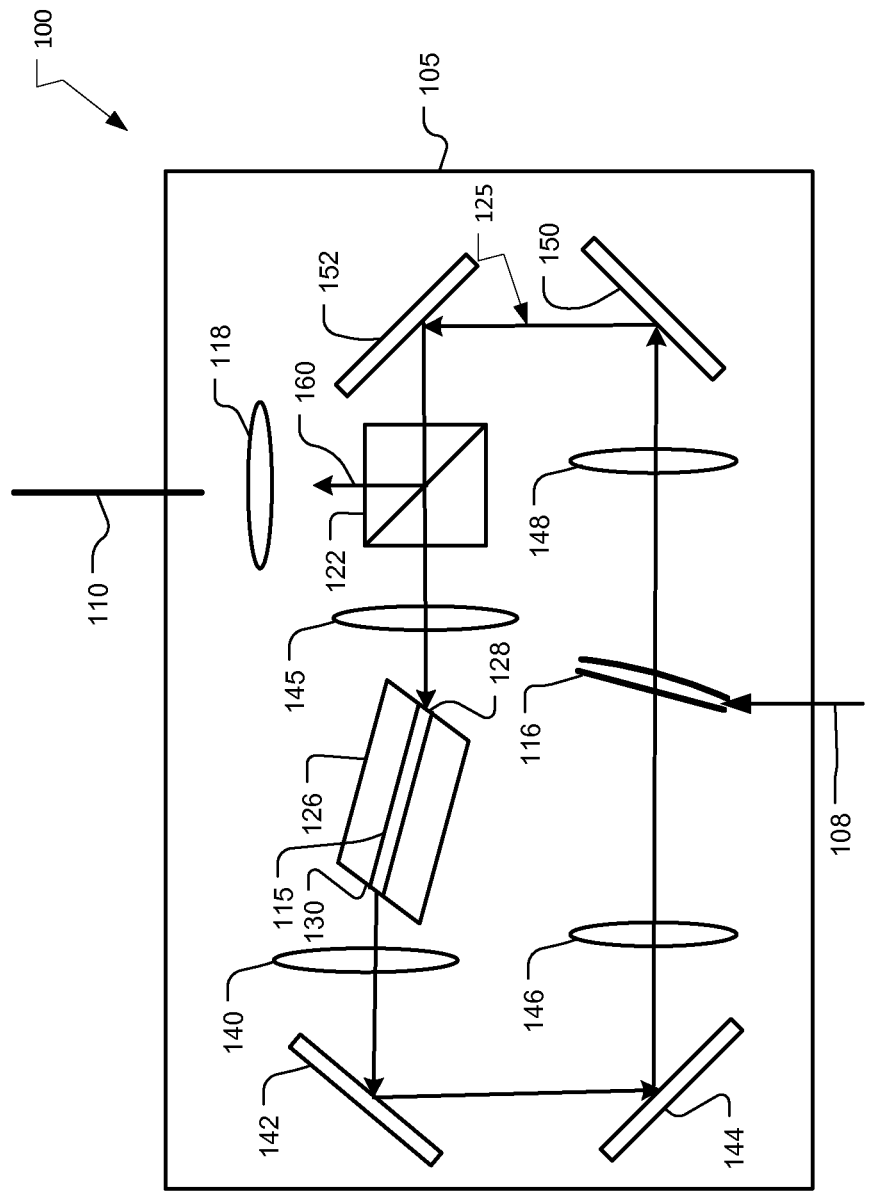
FIG. 6 is a schematic diagram illustrating a ring cavity swept laser according to a sixth embodiment of the present invention.

FIG. 6 shows a swept laser 100 according to a sixth embodiment of the present invention.

This swept laser 100 has a ring cavity configuration. Specifically, the laser cavity 125 transmits light counterclockwise through the laser cavity 125 that is implemented on bench 105.

In more detail, light is amplified in the gain element 126. In the illustrated example, a semiconductor optical amplifier is used in which both the front facet 128 and the rear facet 130 are antireflection coated. Currently an edge-emitting chip with a linear ridge waveguide is preferred.

The light that exits from the gain element 126 is collected by a lens 140. The light is then reflected by a first fold mirror 142 and a second fold mirror 144. A third lens 146 couples the light into the tuning element 116. The light exiting from the tuning element 116 is collected by a third lens 148. The light is then reflected by two fold mirrors 150 and 152 to be directed back to the gain element 126.

This embodiment utilizes an angle-isolated tuning element 116. Specifically, light that is transmitted through the tuning element 116, such as a Fabry Perot tunable filter, stays within the laser cavity 125. Light that is outside the passband, and reflected by the tunable filter 116, is reflected at an angle relative to the axis of the laser cavity 125 and in this way does not return back to the gain element 126 to be amplified.

A signal extraction element 122 is located between the tuning element 116 and the gain element 126. It is specifically located downstream of the tuning element 116 and upstream of the gain element 126 within the ring cavity 125. In this way, the signal extraction element 122 functions as a high coherence optical signal output port and diverts a portion of the light circulating within the optical cavity 125 as the output tunable optical signal 160. This tunable optical signal in the illustrated example is collected by the output lens 118 and coupled into the optical fiber 110.

Figure 7:
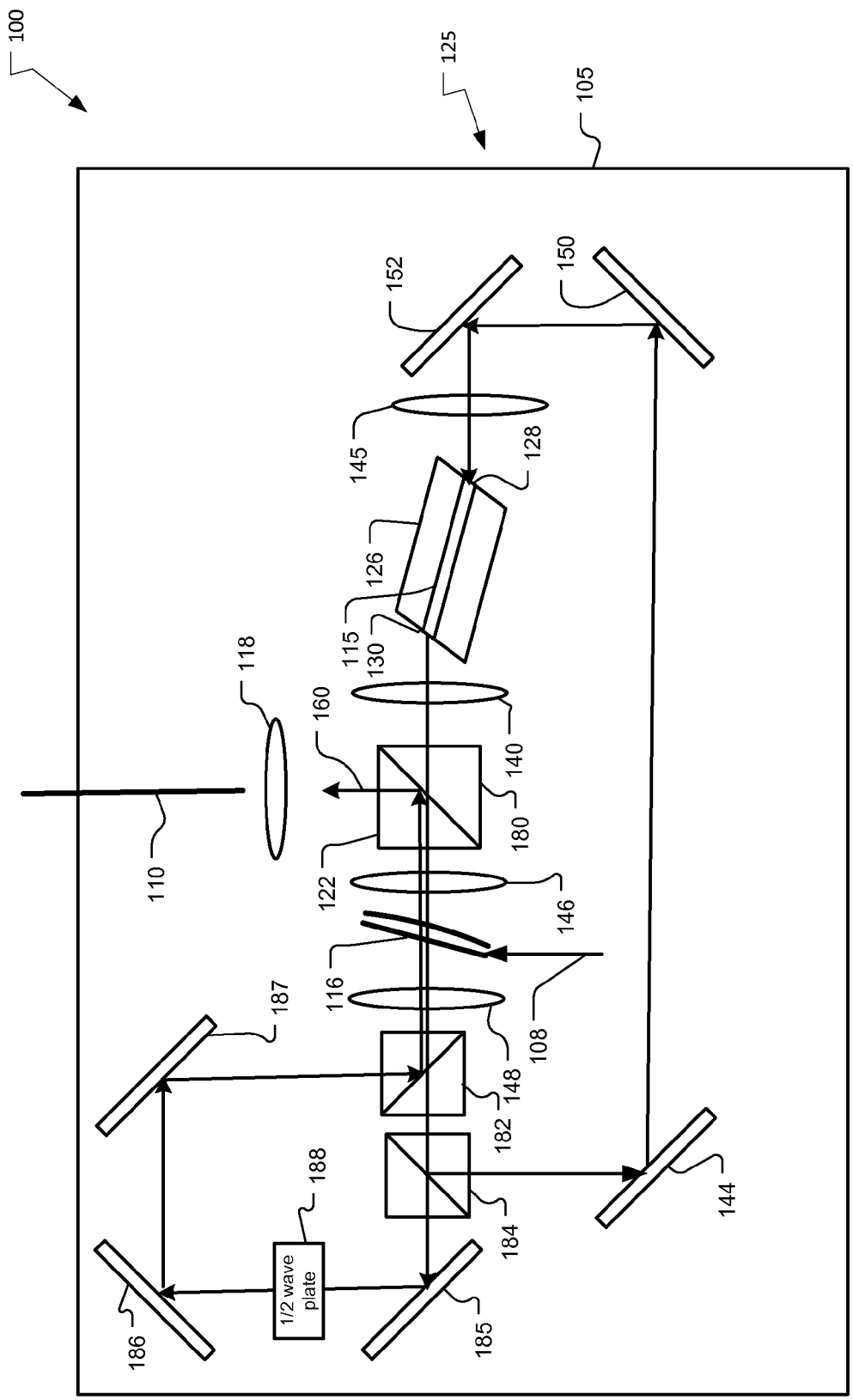
FIG. 7 is a schematic diagram illustrating a ring cavity swept laser according to a sixth embodiment of the present invention.

FIG. 7 shows a swept laser 100 according to a seventh embodiment of the present invention.

This swept laser 100 also has a ring cavity configuration. Specifically, the laser cavity 125 transmits light counterclockwise through the laser cavity 125, which is implemented on bench 105.

In more detail, light is amplified in the gain element 126. In the illustrated example, a semiconductor optical amplifier is used in which both the front facet 128 and the rear facet 130 are antireflection coated.

The light that exits from the gain element 126 is collected by a lens 140.

The lens 140 collimates the light so that it is transmitted through a first polarization beam splitter 180. The configuration of the polarization beam splitter 180 and the polarization of the light exiting from the gain element 126 is such that the light is transmitted directly through the polarization beam splitter 180. For example, if the light from the gain element 126 is polarized in a direction that is parallel to the plane of the bench 105, then the first polarization beam splitter is transmissive to that parallel polarization.

The light exiting from the first polarization beam splitter 180 is then focused by a lens 146 to be coupled into the tuning element 116. Light exiting from the tuning element 116 is been collected by lens 148 and collimated. The light is then transmitted through a second polarization beam splitter 182. Again, the polarization of the light and the second polarization beam splitter 182 are configured so that the light is transmitted directly through the second polarization beam splitter 182.

Light exiting from the second polarization beam splitter 182 is then coupled into a beam splitter 184. The beam splitter 184 is configured to reflect a portion of the light and allow the other portion to pass directly through the beam splitter 184. In one example, the beam splitter will 184 reflects about 50% of the light. In other examples, it reflects 80% or more of the light.

The light that is reflected by the beam splitter 184 remains within the laser cavity 125, in the illustrated embodiment. Specifically it is reflected by a first fold mirror 144. It is then reflected by a second fold mirror 150, followed by a subsequent fold mirror 152. These fold mirrors complete the ring cavity.

The light passing through the ring cavity is then collected by lens 145 and coupled into the entrance facet 128 of the gain element 126.

The light that is transmitted through the beam splitter 184 is reflected to be returned back to pass through the tuning element 116. Its polarization, however, on this return path is rotated 90°. As a result, it is reflected by both the second polarization beam splitter 182 and the first polarization beam splitter 180.

In more detail, the light that is transmitted through the first polarization beam splitter 184 is reflected by a series of fold mirrors 185, 186, and 187 or other optical elements such as fiber to form a return path. On this return path through the series of mirrors, a half wave plate 188 is used to rotate the polarization of the light by 90°.

As a result, with this rotated polarization, the light reflected by fold mirror 187 and received by the second polarization beam splitter 182 is reflected to be collected by lens 148 and again coupled into the tuning element 116. Its direction of propagation is counter to the predominant direction of propagation for the light in the laser cavity 125.

Light exiting from the tuning element 116, propagating in the contra propagation direction, is collimated by lens 146 and coupled into the first polarization beam splitter 180. With its polarization, this returning light is reflected by the polarization beam splitter 180, which also functions as the light extraction element, to be coupled to the output port. Specifically, in the illustrated embodiment, the light is collected by the lens 118 and coupled into the optical fiber 110.

The advantage of this embodiment is that the light that is produced at the output port has been twice filtered by the tuning element 116 to counteract the spectral broadening from the chirp introduced by the gain element 126, for example.

Figure 8:
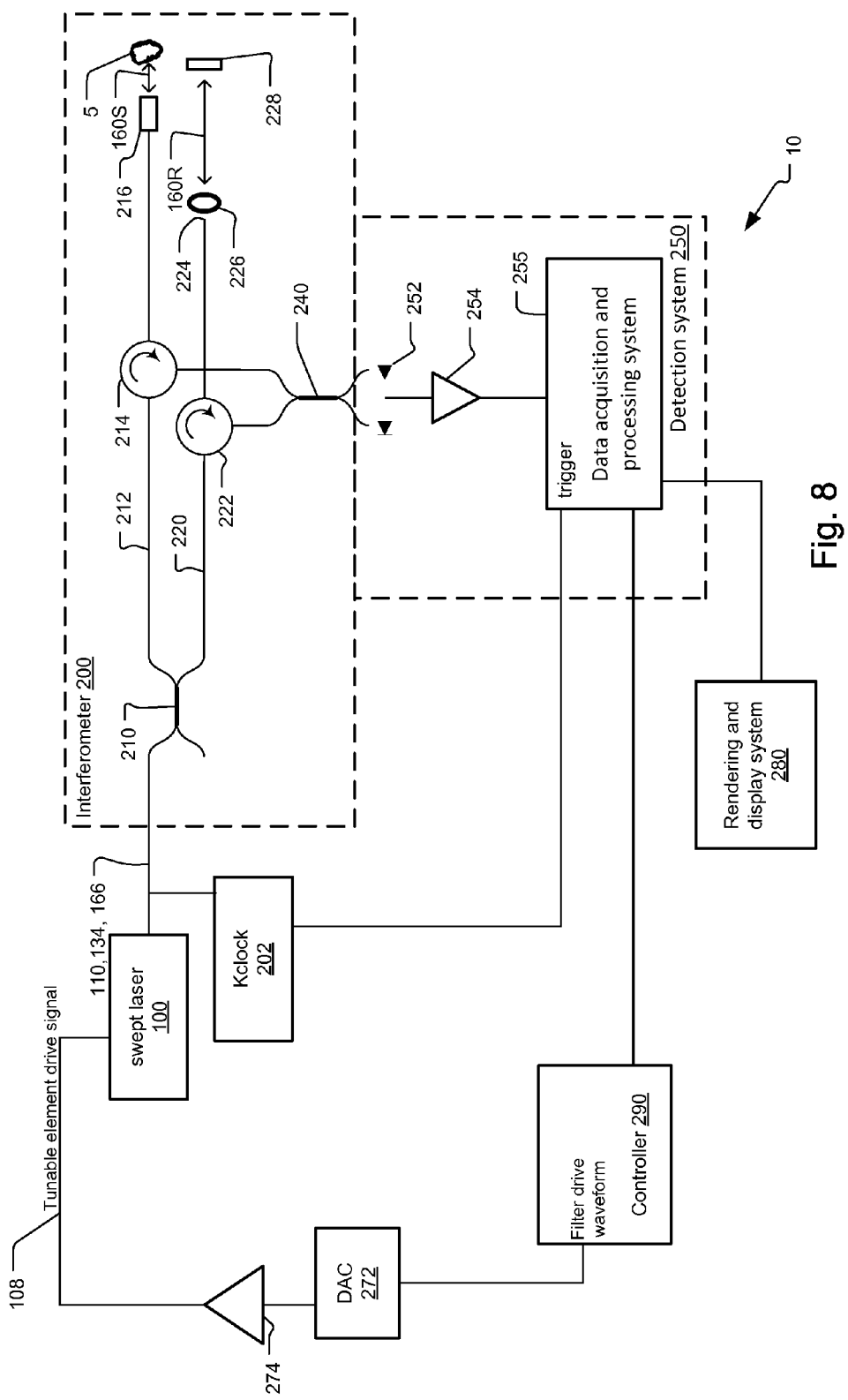
FIG. 8 is a schematic diagram of an optical coherence tomography system using the inventive swept laser.

FIG. 8 shows an optical coherence analysis system 10 using the swept laser 100, which has been constructed according to the principles of the present invention.

The swept laser 100 generates the tunable or swept optical signal on optical fiber 110 that is transmitted to interferometer 200. The swept optical signal scans over a scan band with a narrowband emission.

In some embodiments, the light with other coherence lengths is provided such as on optical fibers 134 and 166 in the previously described embodiments.

In other cases, longer coherence length versions of the tunable signal are provided to a k-clock system 202. In one example, the tunable signals provided on fibers 110 or 166 are used by the k-clock system 202 to generate the kclock, whereas the higher power versions of the tunable signal on fibers 134 are provided to the interferometer 200 and the sample 5. This system filters the tunable signal as produced k-clock signals that are used to trigger the sampling of the data acquisition system 255 at evenly spaced increments of the scanning of the tunable signal through the scan band.

A controller 290 generates a drive waveform that is supplied to a digital to analog converter 272. This generates a tunable optical element drive signal 108 that is amplified by amplifier 274 and applied to the tuning element of 116 of the swept laser 100.

The swept laser 100 is generally intended for high speed tuning to generate swept optical signals that repeatedly scan over the scan band(s) at rates of greater than 1 kiloHertz (kHz). In current embodiments, tuning element drive signal 108 that is applied to the tuning element 116 of the swept laser 100 repeatedly tunes the element 116 over the scanband at speeds greater than 20 or 100 kHz. In very high speed embodiments, the swept laser 100 tunes at speeds greater than 200 or 500 kHz.

Typically, the width of the tuning or scan band provided by the tuning element 116 is greater than 10 nanometers (nm). In the current embodiments, it is preferably between 50 and 150 nm, although even wider tuning bands are contemplated in some examples.

In the current embodiment, a Mach-Zehnder-type interferometer 200 is used to analyze the optical signals from the sample 5. The swept optical signal from the swept optical source system 100 is transmitted on fiber 110 to a 90/10 optical fiber coupler 210. The swept optical signal is divided by the coupler 210 between a reference arm 220 and a sample arm 212 of the system.

The optical fiber of the reference arm 220 terminates at the fiber endface 224. The tunable optical signal light 160R (or alternatively 162R or 164R) exiting from the reference arm fiber endface 224 is collimated by a lens 226 and then reflected by a mirror 228 to return back, in some exemplary implementations.

The external mirror 228 has an adjustable fiber to mirror distance, in one example. This distance determines the depth range being imaged, i.e. the position in the sample 5 of the zero path length difference between the reference arm 220 and the sample arm 212. The distance is adjusted for different sampling probes and/or imaged samples. Light returning from the reference mirror 228 is returned to a reference arm circulator 222 and directed to a 50/50 fiber coupler 240.

The fiber on the sample arm 212 terminates at the sample arm probe 216. The exiting swept optical signal 160S (or alternatively 162S or 164S) is focused by the probe 216 onto the sample 5. Light returning from the sample 5 is returned to a sample arm circulator 214 and directed to the 50/50 fiber coupler 240.

The reference arm signal and the sample arm signal are combined in the fiber coupler 240 to generate an interference signal.

The interference signal is detected a detection system 250. Specifically, a balanced receiver, comprising two detectors 252, is located at each of the outputs of the fiber coupler 240. The electronic interference signal from the balanced receiver 252 is amplified by amplifier 254.

A data acquisition system 255 of the detection system 250 is used to sample the interference signal output from the amplifier 254. In one embodiment, the sampling is performed in response to the k-clock from the k-clock system 202.

Once a complete data set has been collected of the sample 5 by spatially raster scanning the focused probe beam point over the sample, in a Cartesian geometry, x-y, fashion or a cylindrical geometry theta-z fashion, and the spectral response at each one of these points is generated from the frequency tuning of the swept laser 100, the rendering/display system 280 performs a Fourier transform on the data in order to reconstruct the image and perform a 2D or 3D tomographic reconstruction of the sample 5. This information generated by the rendering system 280 can then be displayed on a video monitor.

In one application, the probe 216 is inserted into blood vessels and used to scan the inner wall of arteries and veins. In other examples, other analysis modalities are included in the probe such as intravascular ultrasound (IVUS), forward looking IVUS (FLIVUS), high-intensity focused ultrasound (HIFU), pressure sensing wires and image guided therapeutic devices. In still other applications, the probe is used to scan different portions of an eye or tooth or other structure of a patient or animal.

While this invention has been particularly shown and described with references to preferred embodiments thereof, it will be understood by those skilled in the art that various changes in form and details may be made therein without departing from the scope of the invention encompassed by the appended claims.

What is claimed is:

1. A swept laser that generates a swept optical signal, the swept laser comprising:
    a laser cavity in which the swept optical signal is generated;
    a tuning element for a controlling an optical frequency of the swept optical signal;
    a gain element for amplifying light in the laser cavity; and
    an optical signal extraction element located in the laser cavity between the tuning element and the gain element for coupling the swept optical signal from the laser cavity after being filtered by the tuning element but before amplification by the gain element.

2. The swept laser of claim 1, wherein the laser cavity is a linear cavity and the signal extraction element is located downstream of the tuning element but upstream of the gain element.

3. The swept laser of claim 1, wherein the signal extraction element is a beam splitter.

4. The swept laser of claim 1, wherein the tuning element is a Fabry Perot tunable filter.

5. The swept laser of claim 4, further comprising quarter wave plates on either side of the tuning element to rotate the polarization of the optical signal within the laser cavity so that light transmitted through the tunable filter has a polarization that is appropriate for amplification by the gain element whereas light that is rejected by the tunable filter has a polarization that is orthogonal to the polarization at which the gain element amplifies light.

6. The swept laser of claim 1, wherein the gain element is a reflective semiconductor optical amplifier.

7. The swept laser of claim 1, further comprising a low coherence signal extraction port through which a lower coherence version of the swept optical signal is provided.

8. The swept laser of claim 1, wherein the laser cavity is a ring cavity and the swept optical signal is directed to pass through the tuning element a second time before being coupled from the cavity by the optical extraction element.

9. The swept laser of claim 8, wherein the signal extraction element is located downstream of the tuning element but upstream of the gain element.

10. The swept laser of claim 1, wherein the tuning element controls the optical frequency of the swept optical signal to sweep through a scan band of greater than 50 nanometers at greater than 5 nanometers per microsecond.

11. An optical coherence tomography system, comprising:
   an interferometer that combines a swept optical signal from a sample and from a reference path to generate an interference signal;
   a swept laser that generates the swept optical signal, the swept laser comprising a laser cavity, a gain element or amplifying light in the laser cavity, and an optical signal extraction element located within the laser cavity for coupling the swept optical signal from the laser cavity prior to amplification by the gain element; and
   a detection system that detects the interference signal.

12. The system of claim 11, wherein the laser cavity is a linear cavity and the signal extraction element is located downstream of a tuning element within the laser cavity but upstream of the gain element.

13. The system of claim 12, wherein the signal extraction element is a beam splitter.

14. The system of claim 11, further comprising a tunable filter within the laser cavity.

15. The system of claim 14, further comprising quarter wave plates on either side of the tuning element to rotate the polarization of the optical signal within the laser cavity so that light transmitted through the tunable filter has a polarization that is appropriate for amplification by the gain element whereas light that is rejected by the tunable filter has a polarization that is orthogonal to the polarization at which the gain element amplifies light.

16. The system of claim 11, wherein the gain element is a reflective semiconductor optical amplifier.

17. The system of claim 11, further comprising a low coherence signal extraction port that generates a lower coherence version of the swept optical signal.

18. The system of claim 11, wherein the laser cavity is a ring cavity and the swept optical signal is directed to pass through a tunable element a second time before being coupled from the cavity by the optical extraction element.

19. The system of claim 11, wherein the signal extraction element is located downstream of a tuning element within the laser cavity but upstream of the gain element.

20. The system of claim 11, wherein the swept laser sweeps through a scan band of greater than 50 nanometers at greater than 5 nanometers per microsecond.

* * * * *